United States Patent [19]

Kruse et al.

[11] Patent Number: 5,042,386
[45] Date of Patent: Aug. 27, 1991

[54] DESTRUCTIVE DEVICE FOR METAL OXIDE-SEMICONDUCTORS

[75] Inventors: Howard W. Kruse; Richard A. Breitengross, both of Ridgecrest, Calif.

[73] Assignee: The United States of America as represented by the Secretary of the Navy, Washington, D.C.

[21] Appl. No.: 510,842

[22] Filed: Sep. 27, 1974

[51] Int. Cl.$^5$ .................. C06B 45/10; H01H 37/76
[52] U.S. Cl. .................. 102/293; 102/364; 149/19.3; 149/37; 149/40; 149/41; 307/202.1
[58] Field of Search .................. 149/19.23, 20, 43, 40, 149/37, 41; 102/90, 364, 293; 174/68.5; 307/202 A, 202.1; 109/36, 37

[56] References Cited

U.S. PATENT DOCUMENTS

| | | | |
|---|---|---|---|
| 3,394,218 | 7/1968 | Foudriat | 149/2 |
| 3,498,857 | 3/1970 | Lehikoenen | 149/43 |
| 3,638,573 | 2/1972 | Campbell | 102/90 |
| 3,671,341 | 6/1972 | Dieroff | 149/19.3 |
| 3,732,132 | 5/1973 | Merrow et al. | 149/19.3 |
| 3,740,277 | 6/1973 | Poulin et al. | 174/68.5 |
| 3,753,813 | 8/1973 | Dieroff | 149/19.3 |
| 3,882,323 | 5/1975 | Smolker | 149/2 |

Primary Examiner—Harold J. Tudor
Attorney, Agent, or Firm—Melvin J. Sliwka; Sol Sheinbein

[57] ABSTRACT

A pyrotechnic composition containing from 55 to 65 percent by weight $Fe_2O_3$ powder, 15 to 25 percent by weight aluminum powder, 5 to 15 percent by weight $Ba(NO_3)_2$, 2 to 3 percent by weight $MoS_2$ and 5 to 10 percent by weight Viton A (a copolymer of vinylidene fluoride and hexafluoropropylene) is disclosed as being useful in the destruction of metal oxide-semiconductor chips.

3 Claims, 1 Drawing Sheet

DESTRUCTIVE DEVICE FOR METAL OXIDE-SEMICONDUCTORS

BACKGROUND OF THE INVENTION

1. Field of the Invention

This invention relates to pyrotechnic compositions. More particularly, this invention relates to pyrotechnic compositions which are useful in destroying metal oxide-semiconductor chips.

2. Description of the Prior Art

Metal oxide semiconductor (MOS) chips are well known. It is further well known the MOS chips often incorporate electronic circuits of a confidential nature, i.e., of a nature such that it would be undesirable to have them fall into the enemies hands intact during a war or military action. Accordingly, since MOS chips containing confidential electronic circuits are widely used in aircraft, missiles and ground-based equipment which might, at any time during a military action, fall into enemy hands, it is desirable to provide some means whereby such MOS chips (and more particularly the electronic circuits printed on them) can be quickly and efficiently destroyed at a moment's notice.

Since MOS chips (it is to be understood that, as used herein the term MOS chips means MOS chips containing electronic circuitry) are often located in military equipment in positions such that it may be necessary for friendly personnel to be near to them even at times when it is desired to destroy them, powerful explosives cannot be used in their destruction. Nor can materials which produce large conflagrations upon burning. It is, therefore, the foremost object of this invention to provide pyrotechnic compositions which can be safely used to destroy MOS chips while friendly personnel are in the immediate vicinity of the chips. It is a further object of this invention to provide knowledge concerning the use of such pyrotechnic compositions.

SUMMARY OF THE INVENTION

According to this invention compositions containing from 55 to 65 weight percent powdered $Fe_2O_3$, from 15 to 25 weight percent powdered aluminum, from 5 to 15 weight percent $Ba(NO_3)_2$ powder, from 2 to 3 weight percent $MoS_2$ powder and from 5 to 10 weight percent of a copolymer of vinylidene fluoride and hexafluoropropylene commonly known as Viton A are used to destroy MOS chips. To use the compositions, suitable amount of the powdered materials are pressed into pellets and coated, on one face, with an ignition mix. The pellets, with their ignition mix coated faces downward, are then placed in silicone rubber housings which retain them in positions spaced from the MOS chips to be destroyed such that suitable standoff distances are provided when they are ignited.

DESCRIPTION OF THE PREFERRED EMBODIMENT

According to the preferred embodiment of this invention, a mixture containing from 55 to 65 weight percent ferric oxide ($Fe_2O_3$) powder; from 15 to 25 weight percent aluminum (Al) powder, from 5 to 15 weight percent barium nitrate [$Ba(NO_3)_2$] powder, from 2 to 3 weight percent molybdenum disulfide ($MoS_2$) powder and from 5 to 10 weight percent Viton A (a copolymer of vinylidene fluoride and hexafluoropropylene) is pressed into a pellet and utilized to destroy metal oxide-semiconductor (MOS) chips which contain electronic circuitry of a confidential nature A pellet containing suitable amounts of the various ingredients may easily be prepared by thoroughly mixing the ingredients and pressing them under a pressure in the range of from about 5000 to about 10,000 psi for dwell times up to about 30 seconds.

Figure 1:
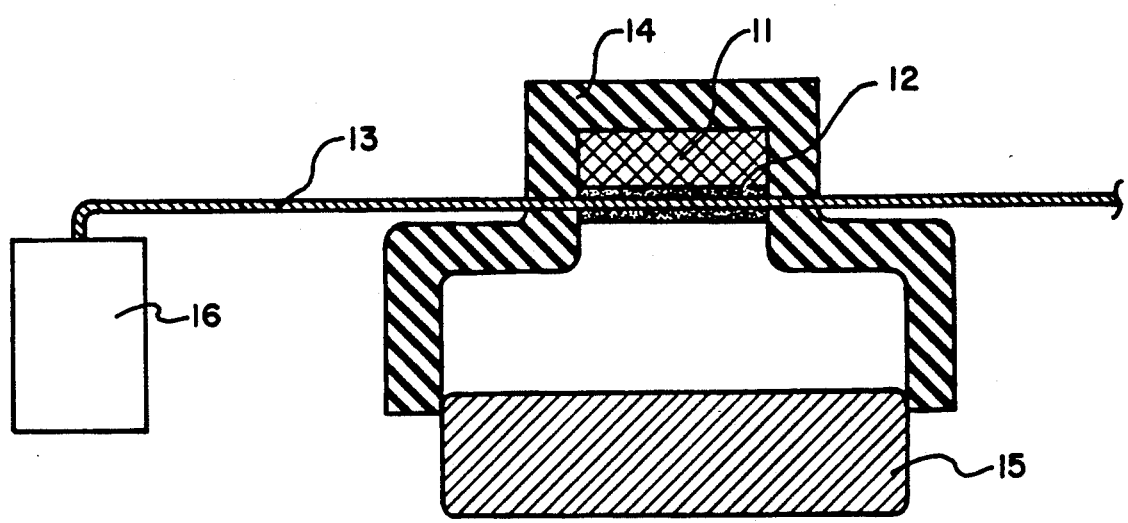
FIG. 1 of the drawing is a cross sectional view of an MOS destruct device in which a pyrotechnic pellet according to this invention is used.

As a specific example of the use of this invention, the reader is referred to the drawing and, in particular, FIG. 1 of the drawing. In actual experiments eight pellets (one of which is indicated by the numeral 11 in the drawing), each containing nominally 60 percent by weight ferric oxide, 20 percent by weight aluminum, 10 percent by weight barium nitrate, 2.5 percent by weight molybdenum disulfide and 7.5 percent by weight Viton A were prepared as described above. The pellets were then placed in openings therefor in silicone rubber housing 14. A Pyrofuze wire 13 was placed across the face of each pellet by drawing the wire through openings in the housing. The face of each pellet that was adjacent to the Pyrofuze wire was then coated with an ignition mix prepared by mixing 60 weight percent magnesium (3–5µ particle size) with 40 weight percent Viton A dissolved in acetone to make a fluid mixture and then adding 70 grams of a mixture of equal parts of aluminum and plaster of paris to 20 grams of the magnesium - Viton A mixture. A coating of ignition mix is indicated in the drawing by the numeral 12. As can be seen from the drawing, the Pyrofuze wire was embedded in the ignition mix. The Pyrofuze wires were then twisted together to attach the destruct units in series so they could all be ignited from a single ignition source. Each of the rubber housings was then placed over a separate MOS chip, one of which is shown in the drawing and indicated by the numeral 15. The housings are constructed so that, when placed in position over the MOS chips, a standoff distance of from 0.1 to 0.25 inch is provided between the pellet held in the housing and the MOS chip. After being placed in position, the pellets were ignited by means of the Pyrofuze wire and ignition mix. The Pyrofuze wire was activated by a mechanical blasting fuze igniter 16. (An electrical power source could be used.) The electronic circuitry on all eight MOS chips was completely destroyed but no large conflagration occurred.

Figure 2:
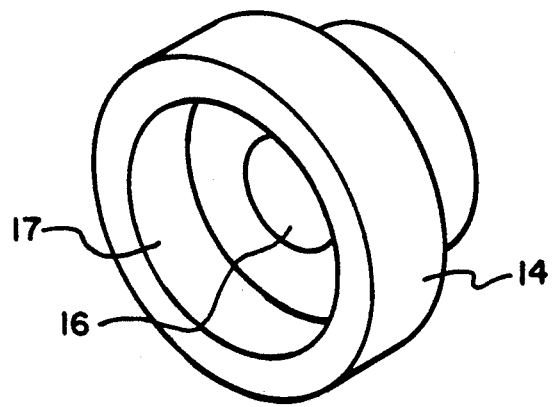
FIG. 2 is a perspective view of a rubber housing in which a pyrotechnic pellet according to this invention is contained in FIG. 1.

FIG. 2 is a perspective view of the rubber housing 14 of FIG. 1. It will be noted that the housing is constructed with a space 16 adapted to closely retain the pellets and a space 17 adapted to provide a standoff distance when the housing is utilized as shown in FIG. 1. In the above-described test, the housing was fabricated from silicone rubber and small holes were drilled through it to accomodate the Pyrofuze wire. It will be evident that, to provide backup ignition systems for use in case the Pyrofuze wire 12 of FIG. 1 is accidently broken, two or more Pyrofuze wires and two or more power sources could be provided.

It should be noted here that, in the course of conducting experiments with destruct devices of the type described above, it was decided to attempt to use the ignition mix on several other hard to ignite materials. In every case, the ignition mix provided excellent results.

What is claimed is:

1. A pyrotechnic composition consisting essentially of from 55 to 65 weight percent ferric oxide, from 15 to 25 weight percent aluminum, from 5 to 15 weight percent barium nitrate, from 2 to 3 weight percent molybdenum disulfide and from 5 to 10 weight percent of a copolymer of vinylidene fluoride and hexafluoropropylene.

2. A method for destroying electronic circuitry on a metal oxide-semiconductor (MOS) chip comprising the steps of:
    (a) mounting a pellet consisting essentially of 55 to 65 weight percent ferric oxide, 15 to 25 weight percent aluminum, 5 to 15 weight percent barium nitrate, 2 to 3 weight percent molybdenum disulfide and from 5 to 10 weight percent of a copolymer of vinylidene fluoride and hexafluoropropylene a suitable distance away from said chip; and
    (b) igniting said pellet.

3. A method according to claim 2 wherein said pellet is coated on one face with an ignition mix prepared by mixing about 2 parts by weight of a composition prepared by mixing about 60 weight percent magnesium (3–5µ particle size) with about 40 percent of a copolymer of vinylidene fluoride and hexafluoropropylene dissolved in acetone with about 7 parts by weight of a mixture containing equal parts of aluminum and plaster of paris and said ignition mix is utilized to assist in the ignition of said pellet.

* * * * *